United States Patent [19]
Dallera

[11] Patent Number: 5,761,829
[45] Date of Patent: Jun. 9, 1998

[54] HIGH YIELD APPARATUS FOR DRYING RIGID OR FLEXIBLE PRINTED CIRCUIT BOARDS

[76] Inventor: Pietro Dallera, Via Della Colombana, 30, 20078 San Colombano al Lambro (Milano), Italy

[21] Appl. No.: 842,813

[22] Filed: Apr. 17, 1997

[30] Foreign Application Priority Data

Apr. 24, 1996 [IT] Italy ................ MI96A0821

[51] Int. Cl.$^6$ ........................... F26B 9/00
[52] U.S. Cl. .................. 34/660; 34/208; 34/216
[58] Field of Search ................ 34/526, 527, 535, 34/545, 573, 617, 618, 619, 620, 638, 646, 660, 207, 208, 216; 361/741, 756; 414/280, 331, 417

[56] References Cited

U.S. PATENT DOCUMENTS

| | | | |
|---|---|---|---|
| 1,190,337 | 7/1916 | Stecher | 34/660 |
| 1,953,300 | 4/1934 | Holman | 34/660 X |
| 4,242,956 | 1/1981 | Bubley et al. | 34/617 X |
| 4,996,939 | 3/1991 | D'Amato | 34/78 X |
| 5,242,096 | 9/1993 | Tsunabuchi et al. | 228/9 |

*Primary Examiner*—Henry A. Bennett
*Assistant Examiner*—Steve Gravini
*Attorney, Agent, or Firm*—Bucknam and Archer

[57] ABSTRACT

The present invention relates to a high yield apparatus for drying rigid or flexible printed circuit boards. The apparatus comprises a box-like structure which defines a drying tunnel, having an inlet opening and an outlet opening. The apparatus comprises moreover heated air circulating means for circulating heated air inside the tunnel as well as driving means for driving the printed circuit boards along the tunnel. The driving means comprise at least a pair of chains which are arranged parallel to one another and are entrained about a first pinion and a second pinion, having parallel axes, and respectively located near the inlet opening and near the outlet opening. The chains are provided with gripping means for supporting the printed circuit boards along the tunnel. The gripping means are suitable to automatically engage the printed circuit boards near the inlet opening and to automatically release the printed circuit boards near the outlet opening.

8 Claims, 4 Drawing Sheets

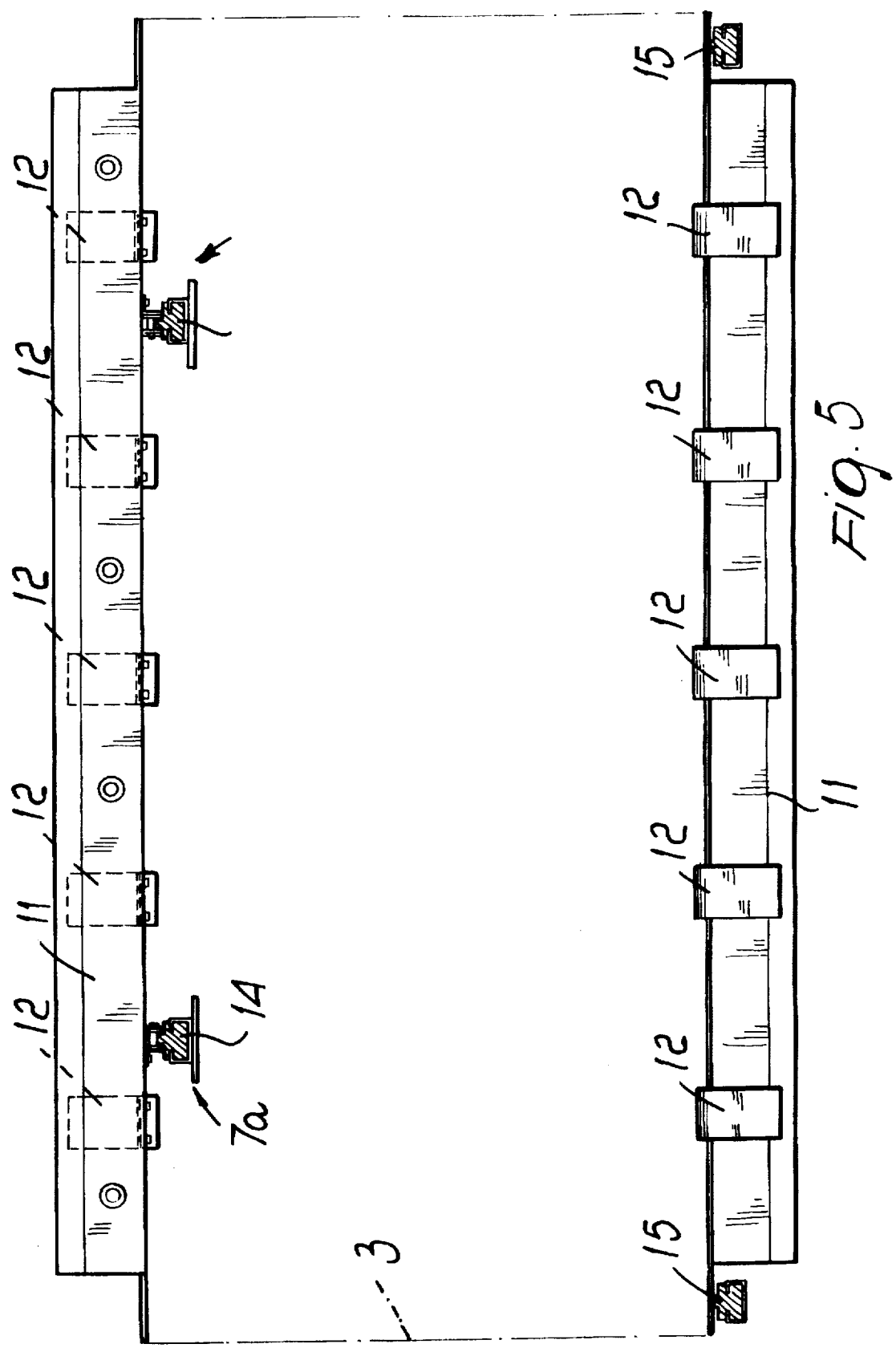

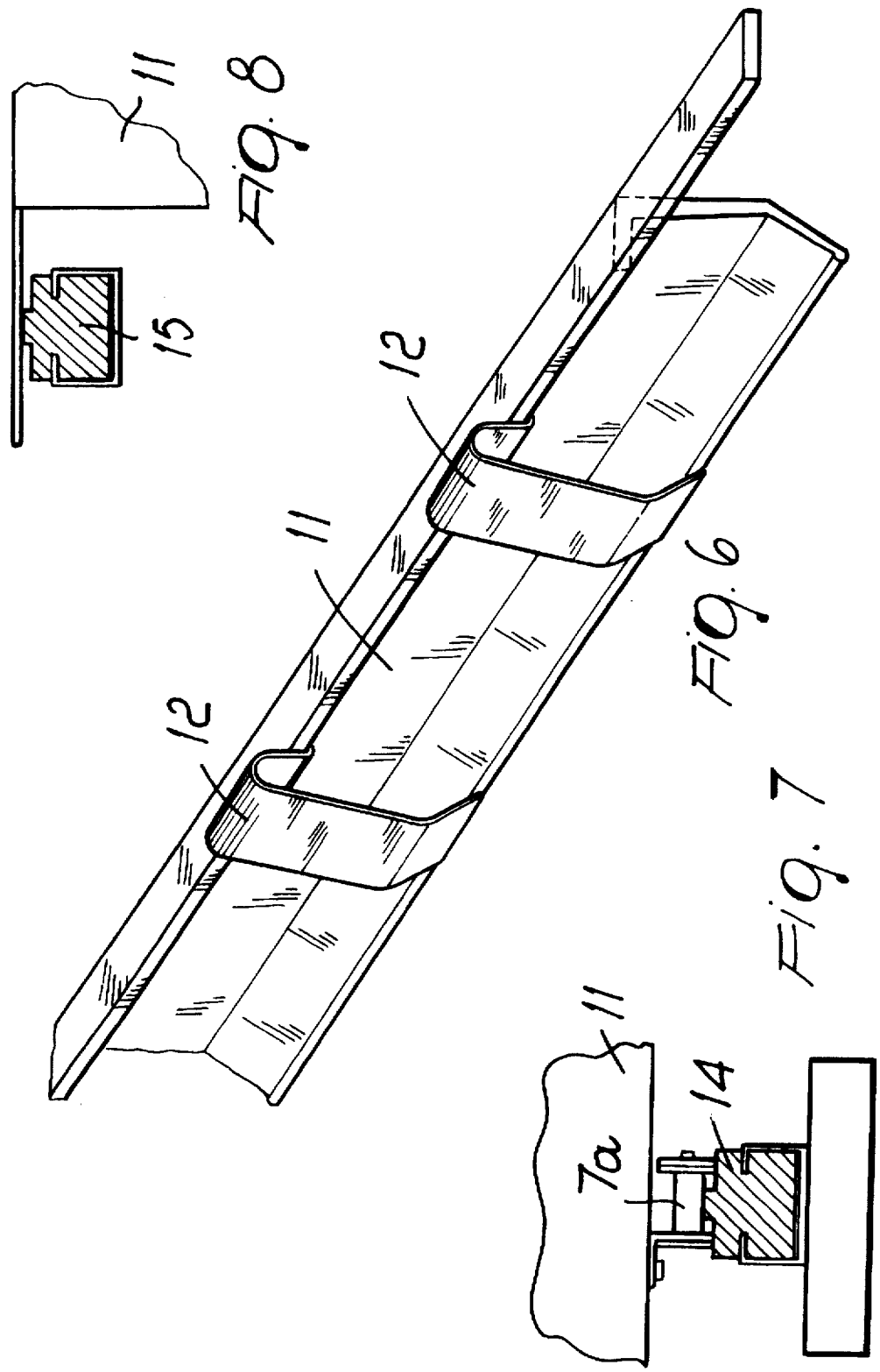

HIGH YIELD APPARATUS FOR DRYING RIGID OR FLEXIBLE PRINTED CIRCUIT BOARDS

BACKGROUND OF THE INVENTION

The present invention relates to a high yield apparatus for drying rigid or flexible printed circuit boards.

As is known, one of the most critical step in making printed circuit boards for electric and electronic apparatus is that of properly drying said printed circuit boards since, during this step, the printed circuit boards and, more specifically, the flexible printed circuit boards, can be undesirably deformed, thereby the deformed boards must be rejected, with a consequent loss negatively affecting the making cost of this type of articles.

The drying of these products is at present performed by an apparatus provided with a drying tunnel, therealong the printed circuit board to be dried are driven.

In order to prevent as far as possible the printed circuit boards being dried from deforming, the boards are accurately arranged on their driving means.

This accurate arrangement, however, does not always provide the desired result, and, anyhow, it requires a comparatively long time for loading the apparatus with the printed circuit boards to be dried, thereby the apparatus efficiency is very small.

Moreover, prior driving means for driving printed circuit boards along the drying tunnel do not allow to fully exploit the space available inside the drying tunnel.

SUMMARY OF THE INVENTION

Accordingly, the aim of the present invention is to provide an apparatus for drying printed circuit boards which has a very high efficiency, i.e. a production yield much greater than that of prior art printed circuit board drying apparatus.

Within the scope of the above mentioned aim, a main object of the present invention is to provide such an apparatus in which the printed circuit boards to be dried and the dried printed circuit boards can be easily and quickly loaded and unloaded.

A further object of the present invention is to provide such an apparatus which allows to fully exploit the space available in the drying tunnel.

According to one aspect of the present invention, the above mentioned aim and objects, as well as yet other objects, which will become more apparent hereinafter, are achieved by an apparatus for drying rigid and flexible printed circuit boards, characterized in that said apparatus comprises a box-like structure defining a drying tunnel having an inlet opening and an outlet opening, heated air circulating means being provided for circulating heated air inside said tunnel, as well as driving means for driving said printed circuit boards along said tunnel, said driving means comprises at least a pair of parallel adjoining chains entrained about a first pinion and a second pinion, said first and second pinions having parallel axes, and being respectively arranged near said inlet opening and near said outlet opening, said chains including gripping means for gripping said printed circuit boards along said tunnel, said gripping means being suitable to automatically engage said printed circuit boards near said inlet opening and to automatically release said printed circuit boards near said outlet opening.

BRIEF DESCRIPTION OF THE DRAWINGS

Further characteristics and advantages of the apparatus according to the present invention will become more apparent hereinafter from the following disclosure of a preferred, though not exclusive, embodiment of said apparatus, which is illustrated, by way of an indicative, but not limitative, example, in the accompanying drawings, where:

FIG. 5 is a vertical cross-sectional view illustrating the printed circuit board driving means for driving the printed circuit boards along the drying tunnel;

FIG. 6 is a perspective view illustrating a detail of the printed circuit board driving means;

FIG. 7 illustrates an enlarged detail of FIG. 5; and

FIG. 8 illustrates another enlarger detail of FIG. 5.

DESCRIPTION OF THE PREFERRED EMBODIMENTS

Figure 1:
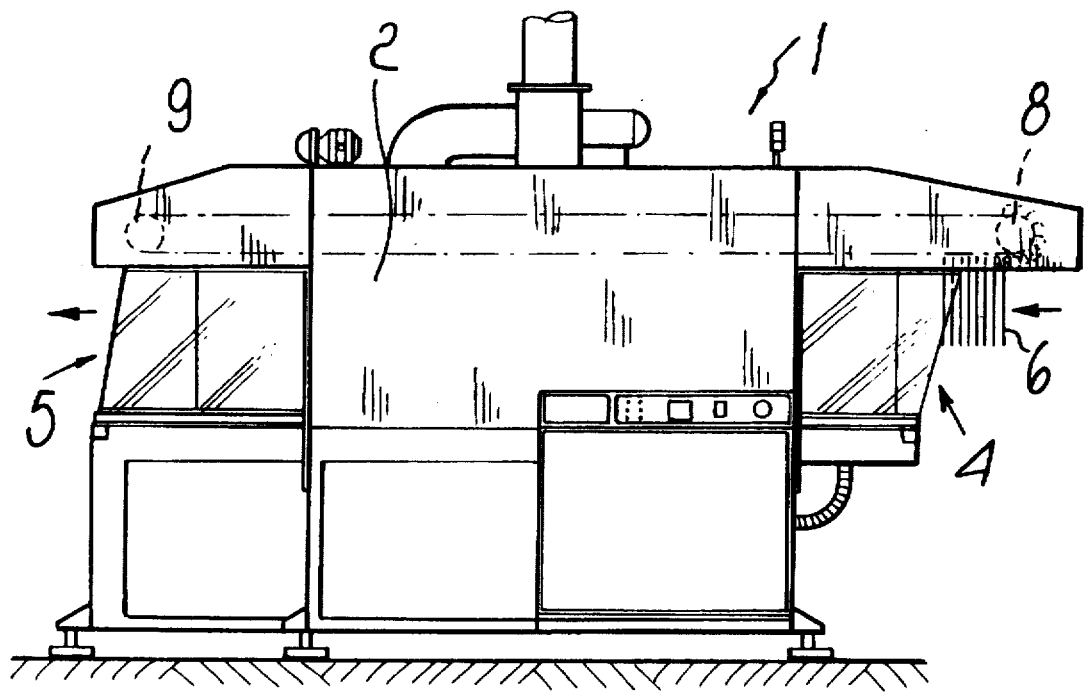
FIG. 1 is a side elevation view illustrating the apparatus according to the present invention.
Figure 2:
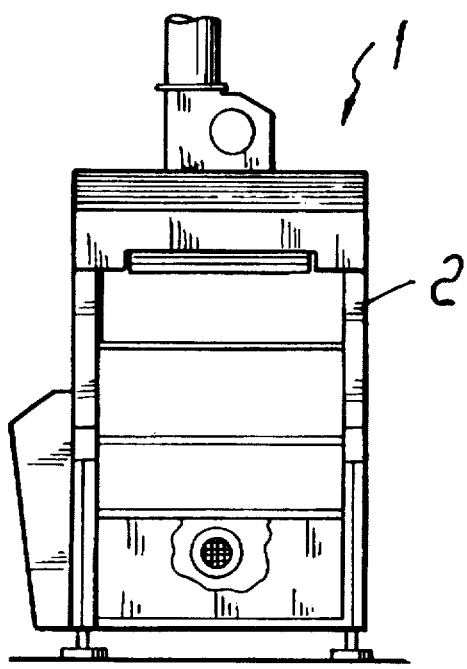
FIG. 2 illustrates the apparatus according to the invention as seen from the inlet side of the printed circuit boards to be dried.
Figure 3:
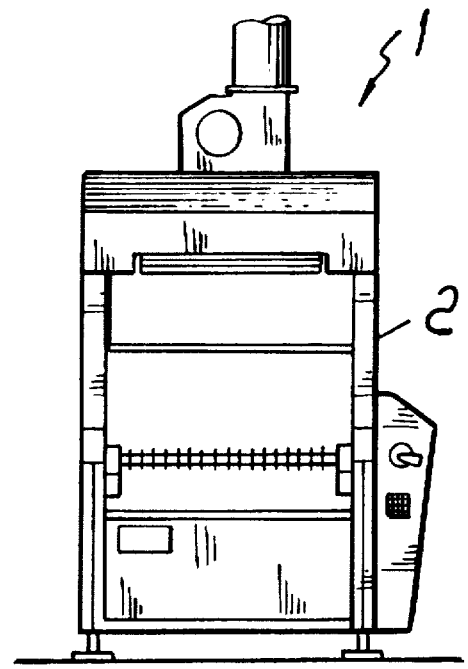
FIG. 3 illustrates the apparatus according to the invention as seen from the outlet side of the dried printed circuit boards.
Figure 4:
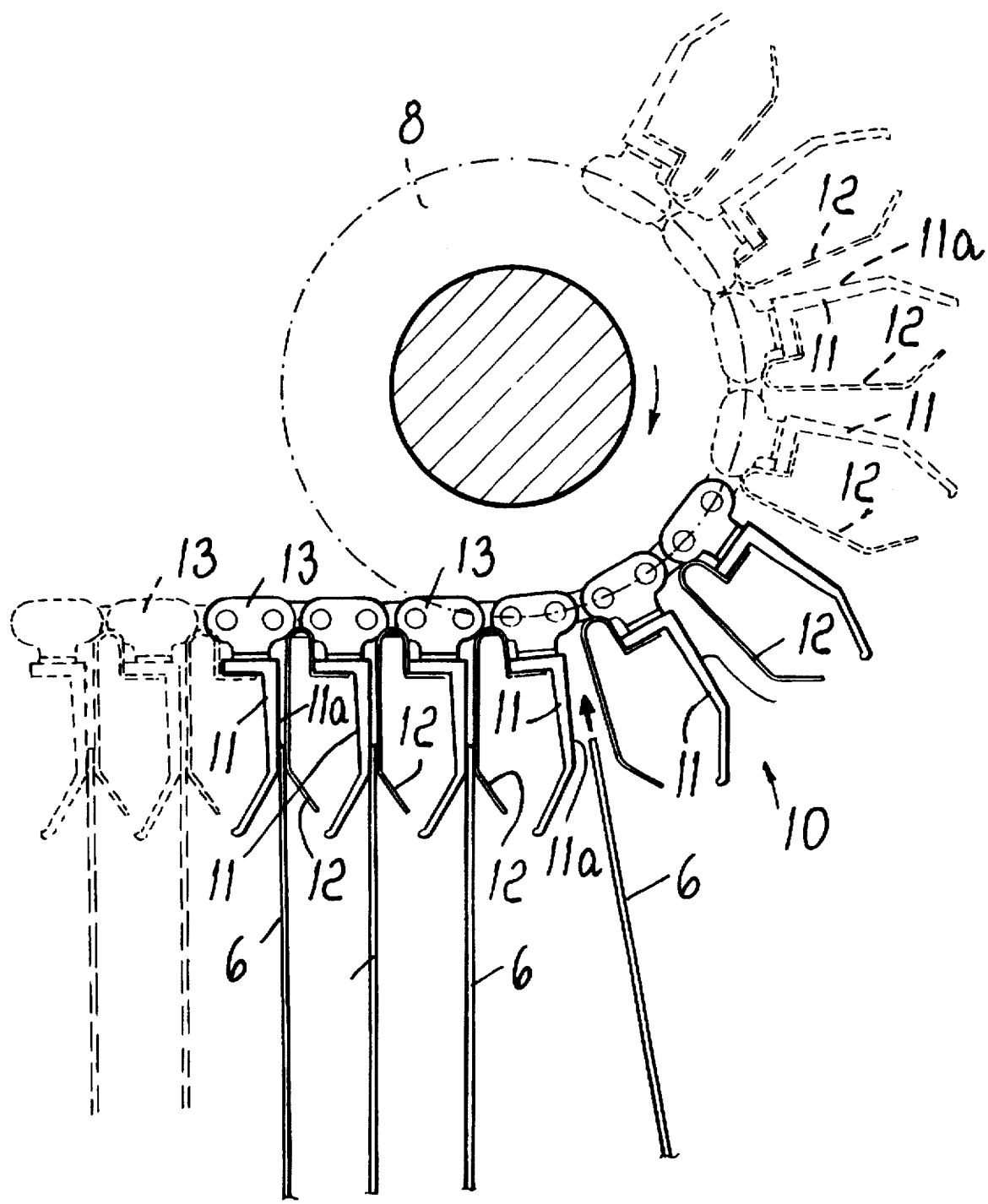
FIG. 4 is a schematic view illustrating one of the chains at the winding region on one of the pinions.

With reference to the number references of the above mentioned figures, the printed circuit board drying apparatus according to the present invention, which has been generally indicated by the reference number 1, comprises a box-like structure 2, which defines, in its inside, a drying tunnel 3, provided with an inlet opening 4 and an outlet opening 5.

The apparatus comprises moreover, in a per se known manner, heated air circulating means for circulating a heated air flow inside the printed circuit board drying tunnel 3.

The apparatus comprises moreover printed circuit board driving means for driving the printed circuit boards 6 to be dried along the drying tunnel 3.

The printed circuit board driving means comprises, in particular, at least a pair of chains 7a and 7b which are arranged in a parallel adjoining relationship and each of which is entrained about a first pinion 8, arranged near the inlet opening 4, and about a second pinion 9, arranged near the outlet opening 5.

More specifically, the pinions 9 arranged near the inlet opening 4 are keyed on the same horizontal shaft, whereas the two pinions 9 arranged near the outlet opening 5 are keyed on an other shaft, also having a horizontal axis, parallel to the axis of the shaft supporting the pinions 8, thereby causing the chains 7a and 7b to extend along a closed loop, the two chain lengths extending between the pinions 8 and 9 being arranged substantially horizontally.

As shown, the chains 7a and 7b are provided with gripping means 10 for supporting, in a hanging attitude, the printed circuit boards 6 along the tunnels.

The mentioned gripping means are so designed as to automatically engage the printed circuit boards 6 near the inlet opening 4 and to automatically release them near the outlet opening 5.

More specifically, the above mentioned gripping means 10 comprise cross-members 11 coupling to one another the chains 7a and 7b, transversely of their extension, and defining each a bearing surface 11a for the printed circuit boards 6.

As shown, the bearing surface 11a extends substantially perpendicular to the chains 7a and 7b.

The gripping means comprise moreover laminar tongs 12 facing the bearing or supporting surfaces 11a of the cross-members 11, in order to hold, against the bearing surfaces 11a of the cross-members 11, the printed circuit boards 6 arranged between said cross-members 11 and tongs 12.

The tongs 12 abutting against the bearing surface 11a of a cross-member 11, are coupled to the links of the chains 7a and 7b adjoining the links thereof bearing the tong 12 abutment cross-member, thereby causing the tongs 12 to swing away from the bearing surface 11a as the chains 7a and 7b switch from a rectilinear path, for example in the chain length extending between the pinions 8 and 9, to a convex curved path, for example where the chains 7a and 7b are entrained about the pinions 9 and for swinging toward the bearing surfaces 11a of the cross-members 11, as the chains switch from a curved convex path, such as, for example, as the chains are entrained on the pinions 8, to a rectilinear path.

Thus, each link 13 of the chains 7a and 7b will practically support a cross-member 11 and a plurality of tongs 12, spaced from one another and arranged on that side of the cross-member 11 which is opposite to the side thereof defining the bearing surface 11a.

In particular, the tongs 12 coupled to a link 13 will face the bearing surface 11a of the cross-member 11 coupled to another chain link.

Since the tongs 12 supported by a chain link 13 cooperate with a cross-members 11 carried by another chain link 13 for holding the printed circuit boards 6 arranged between the tongs 12 and cross-members 11, the tongs 12 carried by a chain link 13 will be caused to automatically approach the cross-member 11 carried by the adjoining chain link as the chains switch from a curved path arrangement to a rectilinear path arrangement.

On the other hand, the cross-member 11 is automatically moved away as the chains switch from a rectilinear path to a curved path.

The free end portions of the cross-members 11 and tongs 12, i.e. the ends thereof which are opposed to the ends thereof coupled to the chain links 13, are bent away from one another, so as to define an introduction mouth for the printed circuit boards 6.

The chains 7a and 7b, at the portions thereof extending from the pinions 8 to the pinions 9, are supported by sliding guides 14, which are made of a low friction coefficient material or are coated by said material.

The cross-members 11 too, at their end portions projecting laterally from the chains 7a and 7b, are supported, at least at that chain length extending from the pinions 9 to the pinions 8, by sliding supporting elements 15, which are made of or coated by a low friction coefficient material.

The operation of the apparatus according to the present invention is as follows.

Near the inlet opening 4, the tongs 12 carried by the links 13 of the chains 7a and 7b, which are yet meshing with the pinions 8, are spaced from the cross-members 11.

The printed circuit boards 6 to be dried can be accordingly easily and quickly introduced between the tongs 12 and cross-members 11 and being automatically held by the tongs 12 against the cross-members 11, as the links 13 of the chains 7a and 7b are moved away from the pinions 8, switching from a curved arrangement to a rectilinear arrangement, as above disclosed.

During the movement inside the drying tunnel 3, the printed circuit boards 6 are dried and, as the links 13 of the chains 7a and 7b are wound on the pinions 9, the tongs 12 are automatically moved away from the cross-members 11, thereby releasing the dried printed board circuits 6 which are engaged and removed from the apparatus.

The vertical-plane arrangement of the printed circuit boards 6 to be dried, as they are displaced inside the drying tunnel 3, will allow to load the printed circuit boards 6 in a very close relationship to one another, thereby fully exploiting the space available inside the drying tunnel 3.

Thus, it is possible to simultaneously dry a very high number of printed circuit boards, in a very reduced space.

Moreover, since the subject apparatus is specifically designed for automatically engaging the printed circuit boards 6 at the inlet of the drying tunnel and to automatically release the dried printed circuit boards 6 at the outlet opening 5, the load and unloading times of the printed circuit boards will be very short, thereby providing a very high production yield.

In particular, the specifically designed supporting system, in which the printed circuit boards are supported in a suspended condition, will allow the printed circuit boards from being deformed during the drying thereof.

From the above disclosure and from the observation of the figures of the accompanying drawings, it should be apparent that the invention fully achieves the intended aim and objects.

In particular, the fact is to be pointed out that an apparatus has been provided which is suitable to properly dry printed circuit boards either of a rigid or of a flexible type, with a very high production yield.

While the printed circuit board apparatus according to the invention has been disclosed and illustrated with reference to a preferred embodiment thereof, it should be apparent that the disclosed embodiment is susceptible to several modifications and variations all of which will come within the invention scope.

In practicing the invention, the used materials, as well as the contingent size and shapes, can be any, depending on requirements.

I claim:

1. An apparatus for drying rigid and flexible printed circuit boards, characterized in that said apparatus comprises a box-like structure defining a drying tunnel having an inlet opening and an outlet opening, heated air circulating means being provided for circulating heated air inside said tunnel, as well as driving means for driving said printed circuit boards along said tunnel, said driving means comprises at least a pair of parallel adjoining chains entrained about a first pinion and a second pinion, said first and second pinions having parallel axes, and being respectively arranged near said inlet opening and near said outlet opening, said chains including gripping means for gripping said printed circuit boards along said tunnel, said gripping means being suitable to automatically engage said printed circuit boards near said inlet opening and to automatically release said printed circuit boards near said outlet opening.

2. An apparatus according to claim 1, characterized in that said gripping means comprises cross-members transversely coupling said chains and defining each a bearing surface for said printed circuit boards, said bearing surfaces extending substanstantially perpendicular to said chains; laminar tongs facing said bearing surfaces of one of said cross-members being coupled to the links of said chains adjoining the links thereof bearing the cross-member thereagainst said tongs abut for causing said tong to swing away from the related bearing surface, as said chains switch from a rectilinear path to a curved convex path and to cause said tongs to approach the related bearing surface as said chains switch from a curved convex path to a rectilinear path.

3. An apparatus according to claim 2, characterized in that said tongs are coupled to a said cross-member on a side thereof opposite to the side whereof defining said bearing surface and facing to said bearing surface defined by an adjoining cross-member along the extension of said chains.

4. An apparatus according to claim 2, characterized in that said tongs are spaced from one another along the extension of the related cross-members transversely of said chains.

5. An apparatus according to claim 2, characterized in that the free end portions of said cross-members and tongs facing the bearing surface thereof are bent away from one another in order to define a receiving mouth for receiving therein said printed circuit boards.

6. An apparatus according to claim 1, characterized in that said chain, between two said pinions, extend substantially horizontally.

7. An apparatus according to claim 1, characterized in that said apparatus comprises moreover sliding supporting elements made of a low friction material for said cross-members, along that portion of said chains extending from the first pinion to the second pinion.

8. An apparatus according to claim 1, characterized in that said apparatus comprises moreover sliding guides made of a low friction material for said chains along the length of said chains extending from the second pinion to the first pinion.

* * * * *